United States Patent [19]

Namiki et al.

[11] 4,268,601
[45] May 19, 1981

[54] PHOTOSENSITIVE IMAGE FORMING MATERIAL AND AN IMAGE FORMING METHOD USING SAME

[75] Inventors: Tomizo Namiki; Fumiaki Shinozaki; Tomoaki Ikeda, all of Asaka, Japan

[73] Assignee: Fuji Photo Film Co., Ltd., Minami-ashigara, Japan

[21] Appl. No.: 925,147

[22] Filed: Jul. 17, 1978

[30] Foreign Application Priority Data

Jul. 15, 1977 [JP] Japan ................... 52-84698

[51] Int. Cl.³ .............. G03C 1/80; G03C 1/52; G03C 1/68; G03F 1/00
[52] U.S. Cl. .................... 430/159; 430/160; 430/166; 430/167; 430/271; 430/281; 430/283; 430/286; 430/287; 430/294; 430/299; 430/258; 430/263; 430/531; 430/536
[58] Field of Search ............. 96/75, 91 D, 91 R, 83, 96/87 R, 36, 35.1, 115 R, 115 P; 430/159, 160, 166, 167, 271, 281, 283, 286, 287, 294, 299, 258, 263, 531, 533, 534, 535, 536

[56] References Cited

U.S. PATENT DOCUMENTS

| | | | |
|---|---|---|---|
| 2,528,395 | 10/1950 | Slifkin | 96/75 |
| 2,779,684 | 1/1957 | Alles | 430/535 |
| 3,136,637 | 6/1964 | Larson | 96/75 |
| 3,443,950 | 5/1969 | Rowlins et al. | 430/536 |
| 3,549,373 | 12/1970 | Hamada et al. | 96/75 |
| 3,645,732 | 2/1972 | Jones | 96/91 D |
| 3,671,236 | 6/1972 | Van Beusekom | 96/75 |
| 3,698,904 | 10/1972 | Fukui et al. | 96/36 |
| 3,721,557 | 3/1973 | Inoue | 96/83 |
| 3,778,272 | 12/1973 | Hepher | 96/83 |
| 3,884,693 | 5/1975 | Bauer et al. | 96/83 |
| 4,002,478 | 1/1977 | Kokawa et al. | 96/35.1 |

FOREIGN PATENT DOCUMENTS 1385241  2/1975  United Kingdom .

OTHER PUBLICATIONS

Fredericks, E. C., *IBM Tech. Discl. Bulletin*, vol. 20, No. 3, 8/1977, p. 992.

*Primary Examiner*—Charles L. Bowers, Jr.
*Attorney, Agent, or Firm*—Sughrue, Rothwell, Mion, Zinn and Macpeak

[57] ABSTRACT

A photosensitive image forming material which comprises a transparent support having thereon, in order, a poly(vinyl alcohol) layer, an alcohol soluble polyamide layer and a photosensitive resin composition layer with at least one of the poly(vinyl alcohol) layer and the photosensitive resin composition layer containing a colorant therein; and an image forming method using the image-forming material. Such a layer structure ensures sufficiently layer good adhesion as well as strippability of the developed image on demand.

21 Claims, No Drawings

PHOTOSENSITIVE IMAGE FORMING MATERIAL AND AN IMAGE FORMING METHOD USING SAME

BACKGROUND OF THE INVENTION

1. Field of the Invention

This invention relates to a photosensitive image forming material and a method of image formation using the same. More particularly, it relates to a photosensitive image forming material comprising a transparent support having thereon, a poly(vinyl alcohol) layer, an alcohol soluble polyamide layer and a photosensitive resin composition layer which is developable with an aqueous developing agent, these three layers being provided on the support in this order and with at least one of the poly(vinyl alcohol) layer or the photosensitive resin composition layer containing a colorant. This invention also relates to an image forming method using the member described above or one of a similar structure thereto except that the polyamide layer is not present, comprising image exposure and development with an aqueous developing agent whereby soluble portions of the photosensitive resin composition layer are removed in conjunction with the corresponding portions of the poly(vinyl alcohol) layer by the aqueous developing agent to form a visible image.

2. Description of the Prior Art

Conventionally, in preparing printing plates, photographically cut-out masks, the so-called "peel masks", have been widely used for the purpose of exposing to light only necessary portions and masking unnecessary portions for "correction" or copying portions of the original. Preparation or cut-out of such a "peel mask", however, has required high concentration on the (cut-out) mask, and is quite time-consuming, too.

An improved method of peel mask preparation exists which comprises imagewise exposure, development, rinsing, drying, etching, rinsing and drying. However, such a method is very complicated, and simpler methods have been desired.

In the past, light-sensitive members containing a colorant (i.e., including dyes and pigments) and comprising a transparent support, an organic solvent-soluble, organic high polymer layer and a photo-hardenable photopolymer layer are well known in the art, and such materials are disclosed, for example, in Japanese patent application (OPI) No. 16124/1972 (the term "OPI" as used herein refers to a "published unexamined Japanese patent application") (corresponding to British Pat. No. 1,385,241; and Canadian Pat. No. 993,709). However, these light-sensitive members exhibit an unsatisfactory stripping performance since the image areas of the hardened photopolymer coating can not readily be separated from the support at the boundary between the underlying solvent-soluble, organic high polymer layer and the support, while, on the other hand, the adhesion between the photopolymer coating and the solvent-soluble, organic high polymer layer is not sufficiently firm. Moreover, in order to develop the photopolymer layer and to remove the organic solvent-soluble organic high polymer layer, an organic solvent or a mixture containing an organic solvent had to be used and this tends to be hazardous to human health as well as to give rise to pollution problems.

SUMMARY OF THE INVENTION

An object of the present invention is to provide an image forming method in which a photosensitive composition layer in conjunction with a strippable layer can be dissolved and removed from the support in a single developing operation with an aqueous developing solution, and also to provide an image forming, photosensitive material for use in such a method.

Another object of the present invention is to provide an image forming method based on a processing with an aqueous developing solution which is less toxic or not toxic and which gives rise to less or no pollution problems and also to provide a photosensitive image forming material used for such a method.

Still another object of the present invention is to provide an image forming material in which a strippable layer is firmly bonded to a light-sensitive resin layer, and to provide an image forming method using such a material.

Still a further object of the present invention is to provide an image forming material in which an image resulting from imagewise exposure followed by development is removable, if desired, from the support due to the presence of an appropriate stripping layer, and in which the stripping layer is bonded to the support firmly enough not to be separated from the support under ordinary conditions encountered during normal handling, and to provide an image forming method using this material.

Accordingly the present invention provides, in one embodiment, a photosensitive image forming material comprising a transparent support having thereon, in order, a poly(vinyl alcohol) layer, an alcohol soluble polyamide layer and a photosensitive resin composition layer which is developable with an aqueous developing solution with at least one of the poly(vinyl alcohol) layer or the photosensitive resin composition layer containing a colorant.

This invention also provides, in another embodiment, an image forming method comprising imagewise exposing a photosensitive image forming material comprising a transparent support having thereon in order, a poly(vinyl alcohol) layer and a photosensitive resin composition layer which is developable with an aqueous developing solution with at least one of these two layers containing a colorant, developing the material with an aqueous developing solution whereby the soluble portions of the photosensitive resin composition layer are removed by dissolution together with the corresponding portions of the poly(vinyl alcohol) layer by the aqueous developing solution to produce a visible image.

In an even further embodiment of this invention, this invention provides an image forming method comprising imagewise exposing a photosensitive image forming material comprising a transparent support having thereon in order, a poly(vinyl alcohol) layer, an alcohol soluble polyamide layer and a photosensitive resin composition layer with at least one of the poly(vinyl alcohol) layer or the photosensitive resin composition layer containing a colorant, developing the material with an aqueous developing solution whereby the soluble portions of the photosensitive resin composition layer are removed by dissolution together with the corresponding portions of the poly(vinyl alcohol) layer by the aqueous developing solution to produce a visible image.

DETAILED DESCRIPTION OF THE INVENTION

The support material used in the present invention supports the poly(vinyl alcohol) layer, the photosensitive resin composition layer developable by an aqueous developing solution and the alcohol soluble polyamide layer which may be provided, if desired, thus fixing each of the layers and enabling each of the layers to exert its respective function. The support material also provides the photosensitive image forming material of the present invention with mechanical strength and dimensional stability in the temperature range between about 0° C. and about 50° C. The term "transparent" support as used herein means supports having a thickness of from about 50 microns to about 2 mm, and more preferably from about 80 microns to about 1.5 mm, which can transmit not less than about 40%, or more preferably not less than about 65%, of incident light with a wavelength of from about 290 nm to about 700 nm. Suitable support materials for the present invention include films of cellulose nitrate, cellulose acetate, cellulose acetate butyrate, cellulose acetate propionate, polystyrene, poly(ethylene terephthalate), polycarbonate, etc., and various laminated films of the above described materials. Among these, a poly(ethylene terephthalate) films is preferred as the support.

The poly(vinyl alcohol) layer comprises mainly poly(vinyl alcohol), which is sufficiently firmly bonded to the surface of the support during ordinary storage and ordinary handling conditions while the poly(vinyl alcohol) layer can be stripped away from the support when this layer is subjected to a force above a certain threshold value after image formation. In the descriptions given hereinafter, this poly(vinyl alcohol) layer will be referred to as a "stripping layer" due to the particular function of this layer. The stripping layer can be removed in the subsequent development, which is explained in detail hereinafter, only at those areas where the overlying photosensitive composition layer is removed by dissolution into an aqueous developing solution, or is rendered easily removable since the stripping layer swells to such an extent that the adhesive bond between the stripping layer and the support becomes weak. With regard to the image areas, the stripping layer participates in image formation in conjunction with the photosensitive resin composition layer remaining on the support after development and also with an alcohol soluble polyamide layer which is provided, if desired, and which is described hereinafter.

The stripping layer comprises predominantly poly(vinyl alcohol), which has a degree of saponification of from about 50 to 100 mole %, and more preferably from about 70 to 100 mole %. In general, poly(vinyl alcohol) is prepared by saponification (i.e., hydrolysis) of e.g., polyvinyl acetate and as a result where the degree of saponification is less than 100% ester groups such as acetate ester groups remain to some degree in the molecule in addition to the hydroxy groups formed by the saponification. A suitable molecular weight for the poly(vinyl alcohol) is one corresponding to a viscosity of a 4 weight % aqueous solution at 20° C. of from about 2 cps to about 70 cps, and more preferably from about 4 to about 20 cps. The thickness of the stripping layer can range from about 0.5 $\mu$m to about 15 $\mu$m, preferably from about 3 $\mu$m to about 8 $\mu$m. The stripping layer can contain various additives in amounts up to about 20% by weight of the poly(vinyl alcohol) polymer, such as a hardening agent, an agent imparting water-resistance, a plasticizer, etc. Suitable hardening agents which can be employed include, for example, glyoxal, dimethylolurea, trimethylolpropane, borax, etc. while a typical plasticizer which can be used is glycerol.

The alcohol soluble polyamide layer which comprises mainly an alcohol soluble polyamide resin helps to strengthen the adhesive bond between the stripping layer and the photosensitive resin composition layer, described hereinafter, thus preventing the photosensitive resin composition layer from peeling off from the image forming material, while, on the other hand, during development the alcohol-soluble polyamide layer is dissolved or swelled by the aqueous developing solution at the areas where the overlying photosensitive resin layer is dissolved and removed by the aqueous developing solution, permitting the aqueous developing solution to reach the stripping layer. As a result, the polyamide layer is removed from the support together with the stripping layer when on stripping the layers are separated from the support. Further, the polyamide layer plays another role of forming an image in conjunction with the photosensitive resin composition layer and the stripping layer remaining on the support after development. Considering these functions of the polyamide layer, the polyamide layer will be referred to hereinafter as an adhesive layer.

The adhesive layer comprises an alcohol soluble polyamide. Suitable examples of alcohol soluble polyamides which can be used in this invention are those described in H. F. Mark, N. G. Gaylord and N. M. Bikales, Ed., *Encyclopedia of Polymer Science and Technology*, vol. 10, pp 463–464 (1969) ("Soluble Polyamide Polymers" in the Section entitled "Polyamide Plastics"), John Wiley & Sons, Inc., New York; those described in Osamu Fukumoto Ed., *Plastics Zairyo Koza*, vol. 16, pp 33–35 (1970) ("Alcohol Soluble Nylons" in the section entitled "Polyamide Resins"), Nikkan Kogyo Shinbun K. K., Tokyo; those described in British Pat. No. 795,961 or U.S. Pat. No. 3,081,168; those described in J. Kosar, *Light-Sensitive Systems*, pp 165 (1965), John Wiley & Sons, Inc., New York; those described in *J. Appl. Phys.*, vol. 33, pp 2914–2915 (1962); those described in *Photo. Sci. Eng.*, vol. 7, pp 238–240 (1963); etc. Specific examples of alcohol soluble polyamides include nylon 6/66/610 (terpolycondensate), $\epsilon$-caprolactam/hexamethylenediamine/adipic acid/bis(4-aminocyclohexyl)methane quaternary polycondensate, N-methoxymethyl nylon, N-ethoxymethyl nylon, etc. Typically nylons soluble in methanol at 25° C. to an extent of a concentration greater than about 0.1% by weight can be used. The thickness of the adhesive layer can range from about 0.05 to about 3 $\mu$m, and more preferably from about 0.1 to about 2.5 $\mu$m.

The photosensitive resin composition layer renders photosensitive material of the present invention and the image forming materials used for the image forming method of the present invention. When this layer is imagewise exposed, hardened and unhardened areas are formed in conformity with the exposure. The hardened and unhardened areas may also be described as solvent insoluble and soluble areas, respectively. Therefore, by development with an aqueous developing solution, the unhardened or soluble areas are removed by dissolution or as a result of softening or swelling (if necessary, with a light rubbing action, e.g., with a brush or a cotton pad) while the hardened or insoluble areas remain on the support to form an image. Further, a cover film or a protective coating may be present on the photosensitive resin composition layer or such an overcoated layer may not be present. Where such an overcoated layer is not present the photosensitive layer should, desirably, possess sufficient mechanical strength to maintain a solid layer structure by itself, but where such an over coated layer is present, the necessary level of physical strength is decreased. The resulting image after development which comprises the areas of the hardened photosensitive resin should preferably have a sufficiently high mechanical strength as well as resistance to a number of solvents.

The photosensitive resin composition layer of the image forming material of the present invention functions to provide an image in conjunction with the underlying stripping layer and the adhesive layer, which may be provided as needed.

The photosensitive resin composition layer used in the present invention should be constructed so that this layer is developable with an aqueous developing solution after imagewise exposure whereby only either of the unexposed or exposed area is selectively dissolved or swollen by the aqueous developing solution, described hereinafter, and removed (if required, with the aid of a light rubbing, e.g., with a brush or cotton pad).

Suitable examples of materials for such a photosensitive resin composition layer include a diazonium salt-/paraformaldehyde condensate as disclosed in Japanese Patent Publication No. 11365/1963, U.S. Pat. No. 2,679,498, U.S. Pat. No. 1,762,033, or in A. R. Materazzi *TAGA Proceedings* pp 241–244 (1967), o-quinonediazides (or o-diazoxide compounds) as disclosed in the Japanese Patent Publication Nos. 3627/1962, 28403/1968 (corresponding to U.S. Pat. No. 3,635,709) and 9610/1970, alkali soluble azide polymers as set forth in Japanese Patent Publication Nos. 28499/1965 and 22085/1970 (corresponding to U.S. Pat. No. 3,475,176), British Pat. No. 843,541, etc., azide compounds, developable with water or an alkaline aqueous developer, set forth in Japanese Patent Publication Nos. 7100/1966, 28725/1969 and 22082/1970 and U.S. Pat. No. 2,692,826, photo-polymerizable acrylamide derivatives as described in F. W. H. Mueller, H. Evans and E. Cerwonka, *Photographic Science & Engineering*, vol. 6, pp 227 (1962), photo-polymerizable compositions containing diacrylate derivatives as set forth in Japanese Patent Publications 342/1960, 8495/1960, 14065/1960, 16614/1960, 4112/1961, 16078/1961, 1306/1962 (corresponding to U.S. Pat. No. 3,157,505), 14657/1962 (corresponding to U.S. Pat. No. 3,012,952), 15810/1963, 1112/1964, 2204/1965 (corresponding to U.S. Pat. Nos. 3,264,103 and 3,395,014) and 12104/1965 (corresponding to U.S. Pat. No. 3,186,844), photo-polymerizable compositions containing acrylic acid esters of pentaerithritol as disclosed in Japanese Patent Publication No. 32714/1971 (corresponding to U.S. Pat. Nos. 3,475,174 and 3,458,311), photo-polymerizable compositions containing methacrylates as set forth in Japanese Patent Publication No. 42450/1971, photopolymerizable compositions which contain polymers having a carboxylic group in side chain thereof in combination with a double bond as set forth in Japanese patent application (OPI) No. 58106/1976 (corresponding to U.S. Application Ser. No. 632,593, filed Nov. 17, 1975), poly(methacrylic acid) containing photo-polymerizable compositions, i.e., a light-sensitive photo-polymerizable composition containing an ethylenically unsaturated compound, a photo-polymerization initiator, and an organic copolymer binder having water-solubilizing groups in the side chains which copolymer contains a repeating unit derived from acrylic or methacrylic acid, and a repeating unit derived from benzyl acrylate, benzyl methacrylate or the like, disclosed in Japanese Patent application (OPI) No. 23632/1977 or Japanese patent application (OPI) No. 99810/1977 (corresponding to U.S. Application Ser. No. 767,865, filed Feb. 11, 1977), photocrosslinkable photosensitive resin compositions comprising a polymer bearing an amino group substituted with aromatic groups and a compound having a polyhalogenated methyl group, and still other photosensitive resin compositions described in J. Kosar, *Light-Sensitive Systems*, John Wiley & Sons, Inc. New York, (1965), T. Tsunoda, *Kankosei Jyushi (Photosensitive Polymers)*, Printing Society of Japan, Publishing Division, (1972), *Photopolymers: Principles, Processes and Materials* (Regional Technical Conference of Society of Plastics Engineers, Inc., Ellenville, New York, (1973) and (1976), M. G. Halpern, *Plastic Printing Plate Manufacture and Technology*, Noyes Data Corp., Park Ridge, N.J. (1971), W. S. Deforest, *Photoresist: Materials and Processes*, McGraw-Hill Book Co., New York (1975), etc.

Since in the present invention the photosensitive resin composition layer of the image forming material is expected to provide an image which is physically strong, having an appropriate stiffness together with a high level of flexibility, and which is resistant to various solvents, the layer preferably is one comprising a photo-polymerizable composition.

Suitable binder compositions for the photo-polymerizable resin layer which is developable using an aqueous developing solution comprise a polymer containing a free carboxylic acid group, an unsaturated monomeric compound including at least one or more, preferably two, ethylenically unsaturated double bonds, and an initiator for photo-polymerization. Suitable polymers containing free carboxylic acid groups include poly(acrylic acid), poly(methacrylic acid), copolymers containing acrylic acid, methacrylic acid, itaconic acid or maleic acid, copolymers containing maleic anhydride, etc. Preferred binders are poly(acrylic acid), poly(methacrylic acid), and copolymers containing acrylic acid or methacrylic acid. A suitable amount of the binder which can be used is about 10 to about 95% by weight, preferably 30 to 70% by weight, based on the total weight of the photosensitive resin layer composition exclusive of the solvent. The photopolymerizable light-sensitive composition may contain various additives depending on the specific needs or properties desired in this layer. Examples of suitable additives include dyes pigments, thermal polymerization, inhibitors, plasticizers, surface active agents, agents to prevent polymerization due to oxygen, matting agents (or surface roughening agents), etc. A suitable dry thickness of the photosensitive resin composition layer is about 0.5 to about 15 $\mu$m, preferably about 1 to about 8 $\mu$m.

In the present invention, at least one of the stripping layer and the photosensitive resin composition layer developable with an aqueous developing solution contains a colorant which can absorb light having a wavelength between about 290 nm and about 700 nm. This wavelength region corresponds to the range from near ultraviolet to the principal region of visible light. The term "near ultraviolet-visible light" will be used to describe this range. The term "colorant" as used herein includes both dyes and pigments. The colorant incorporated in the photosensitive resin composition layer and/or in the stripping layer should preferably be used in an amount such that a transmission optical density of not less than about 2.0 is obtained for electromagnetic radiation of a wavelength of from about 290 nm to about 550 nm. Radiation with wavelengths in this range will be referred to hereinafter as "actinic light". Where the wavelength of the absorption maximum for the colorant differs from that for the photo-polymerization initiator used by not more than about 5 nm, the colorant should desirably be incorporated only in the stripping layer. When the difference in the wavelength of absorption maxima exceeds about 5 nm, such a colorant may be present in either of the photosensitive layer and the stripping layer or in both of these layers. Moreover, two or more colorants with different absorption maxima can be employed in such a manner that the colorant with an absorption maximum closer to that of the initiator (by less than about 5 nm) is incorporated in the stripping layer and that the other colorant with an absorption maximum differing by 5 nm or more from that of the initiator is incorporated in the photosensitive resin composition layer. In either case, the colorant can be used in such an amount that the optical density of the resulting recording member is not lower than about 2.0 for the actinic light.

A preferred method of using the colorant is to incorporate a dye as a colorant in the stripping layer and a pigment as a colorant in the photosensitive layer, respectively. The presence of a pigment in a large amount in the poly(vinyl alcohol) forming the stripping layer often reduces the physical strength of the stripping layer to an undesirable extent, and the adhesion between the stripping layer and the support. Further, a deterioration of the adhesion of the stripping layer to the photosensitive layer or to the adhesive layer is sometimes observed. On the contrary, addition of dyes which are soluble in poly(vinyl alcohol) rarely gives rise to the disadvantages mentioned above. When a dye which is soluble in the photosensitive resin composition is present in the photosensitive layer, a sensitivity reduction takes place to a varying extent. On the contrary, addition of a pigment which is not soluble in the photosensitive resin composition causes a far lesser degree of sensitivity reduction. Accordingly, by incorporating a pigment in the photosensitive resin composition layer and a dye in the stripping layer, not only can a reduction in the amount of colorant necessary be achieved, but also a desirable optical density for the actinic light and spectral absorption characteristic by combining a suitable dye and a suitable pigment each having a different absorption maximum wavelength as well as an absorption range can be achieved in comparison with the case where only a single kind of colorant is present in only one of the photosensitive layer and the stripping layer. A suitble amount of the dye ranges from about 1 to about 40% by weight, and more preferably from about 2 to about 30% by weight, of the total weight of the stripping layer. A suitable amount of the pigment to be added to the photosensitive resin composition layer ranges from about 1 to about 35% by weight of the total weight of the photosensitive resin composition layer. A more preferred range is from about 2 to about 25% by weight.

Some specific examples of colorants suitable for use in the present invention are as follows;

Oil Yellow S (C.I. #1020)
Oil Yellow S-7 (C.I. #11390)
Oil Yellow #55 (C.I. #12700)
Oil Orange #145 (C.I. #12055)
Oil Orange SS (C.I. #12100)
Zapon Fast Orange G (C.I. #18745A)
Kayalon Fast Yellow 4R (C.I. #26090)
Kayalon Fast Yellow YL (C.I. #10338)
Kayalon Fast Orange GR (C.I. #11005)
Suminol Fast Yellow R conc. (C.I. #18835)
Suminol Fast Yellow 2GP (C.I. #18900)
Kayaku Acid Orange II (C.I. #15510)
Kayaku Acid Orange RO (C.I. #15575)
Direct Pure Yellow 5G (C.I. #13920)
Direct Fast Yelow GL (C.I. #29000)
Direct Fast Yellow R (C.I. #29025)
Daiwa Tartrazine (C.I. #19140)
Sumitomo Fast Yellow 4GL (C.I. #18965)
Suminol Fast Orange PO (C.I. #16240)
Sumitomo Acrydine Orange NO; RK conc. (C.I. #46005)
Direct Fast Orange S (C.I. #29150)
Sumilight Orange G conc. (C.I. #29050)
Direct Fast Scarlet 4BS (C.I. #29160)
Sumilight Red F 3B (C.I. #35780)
Sumilight Red 4B (C.I. #28160)
Suminol Fast Red B conc. (C.I. #14680)
Brilliant Scarlet 3R conc. (C.I. 190 16255)
Direct Sky Blue 6B (C.I. #24410)
Direct Blue 2B (C.I. #22610)
Suminol Fast Sky Blue B (C.I. #62105)
Sumitomo Brilliant Blue 5G (C.I. #42120)
Rhodamine B (C.I. #45170)
Microlith Yellow 4G-A (a product of Ciba-Geigy Co.)
Microlith Yellow 2R-A (a product of Ciba-Geigy Co.)
Microlith Red 22396-A (a product of Ciba-Geigy Co.)
Microlith Blue 5G-A (a product of Ciba-Geigy Co.)

The composition for the stripping layer chiefly comprising poly(vinyl alcohol) can be prepared in the form of an aqueous solution using water, and more preferably distilled or deionized water. The composition for the adhesive layer mainly comprising an alcohol-soluble polyamide can be prepared in the form of a solution using a solvent such as an aliphatic alcohol (e.g., methanol, ethanol, propanol, butanol, 2-propanol, t-butyl alcohol, iso-amyl alcohol, etc.) or mixtures of such an aliphatic alcohol and water. The photosensitive resin composition can be dissolved in a variety of organic solvents such as ketones (e.g., acetone, methyl ethyl ketone, methyl isobutyl ketone, diethyl ketone, cyclohexanone, etc.) hydroxyethers (e.g., β-hydroxyethyl methyl ether, β-hydroxyethyl ethyl ether, etc.), hydroxyether esters (e.g., β-acetoxyethyl methyl ether, β-acetoxyethyl ethyl ether, etc.), ethers (e.g., diethyl ether, methyl ethyl ether, diethyl ether, tetrahydrofuran, tetrahydropyran, etc.) or other solvents such as, for example, N,N-dimethylformamide, hexamethylphosphoramide, dimethyl sulfoxide, etc.

Each coating solution thus prepared can be coated on the support sequentially using any known coating method. First of all, the stripping layer is coated on the support, then after drying the stripping layer the adhesive layer may be coated on the stripping layer, if present, and dried, and finally the photosensitive resin composition layer is coated thereon and dried. Alternatively, by employing methods well known in the art, two or three layers can be coated simultaneously wherein the coating solutions for the stripping layer, the adhesive layer and the photosensitive resin composition layer are appropriately formulated. Suitable coating methods which can be used include dip coating, air knife coating, curtain coating, extrusion coating using a hopper as described in U.S. Pat. No. 2,681,294, whirler coating, spray coating, simultaneous multi-coating as disclosed in U.S. Pat. Nos. 2,761,791, 3,508,947, 2,941,898 and 3,526,528, etc.

Each layer is dried after being coated using any known drying method including, for example, natural drying, drying by simple heating, infrared radiation, high frequency induction heating, high frequency electromagnetic radiation, drying using a hot air flow, and combinations therebetween. Suitable drying conditions for the stripping layer and the adhesive layer are temperatures between about 30° and 120° C., and preferably 60° and 110° C. for a time of from about 30 secs. to several hours, and preferably from about 1 minute to 30 minutes; and for the photosensitive resin composition layer are temperatures between about 20° and 130° C. and more preferably about 40° and 120° C. with a drying time in the range of from about 30 secs. to several hours and more preferably from about one to 30 minutes. For a simultaneous multi-layer coating, a temperature range common to the two or more layers involved can be chosen, and the drying time can be extended considering the increase in the total layer thickness, in many cases by a factor roughly proportional to the rate of increase in thickness.

The photosensitive image forming material thus prepared is subjected to an imagewise exposure to actinic light. The actinic light should preferably be in a wavelength region at which the sensitivity of the photosensitive resin composition used is at a maximum. The imagewise exposure can be carried out using known methods for light sensitive materials. Examples of suitable light sources which can be employed are a high pressure mercury arc lamp, a ultra-high pressure mercury arc lamp, a carbon arc, a xenon arc lamp, a tungsten filament incandescent lamp, a luminescent discharge tube, a cathode ray tube, sunlight, etc. The intensity of the actinic light is so selected that the exposure time is in the range of from about 0.1 second to about 1 minute, and more preferably from about 0.5 to about 15 seconds.

The photosensitive image forming material is, after exposure, processed using an aqueous developing solution whereby the photosensitive resin composition layer is dissolved away in the aqueous developing solution selectively at the areas soluble in the developing solution, with simultaneously the underlying stripping layer and the adhesive layer, if it is present, being removed at the same areas as a result of the dissolution or swelling (with the aid of a light rubbing, e.g., with a brush or a cotton pad, if necessary thereof. The remaining areas comprising the photosensitive resin composition layer, the stripping layer and the adhesive layer, if present, constitute an image. When the photosensitive resin composition layer is of a negative-working type represented by compositions based on photo-polymerizable materials, the resulting image comprises exposed photopolymerized, or in some cases crosslinked, hardened regions thereof. When the photosensitive resin composition is of a positive-working type represented by those based on o-quinondiazide derivatives, the remaining image comprises unexposed areas which are not soluble in the developing solution.

The term "aqueous developing solution" as employed in the description of the present invention means water per se, mixtures of water and water-miscible organic solvents, water containing an alkaline compound, and mixtures of water, water-miscible organic solvents and an alkaline compound. Water-miscible organic solvents which can be used are those solvents which can form a homogeneous phase when they are mixed with water in particular ratios of about 50% by volume or less, preferably about 25% by volume or less and more preferably about 5% by volume or less of the organic solvent to the total volume of the mixture. Suitable water-miscible organic solvents include aliphatic alcohols containing up to 6 carbon atoms, e.g., methanol, ethanol, propanol, butanol, 2-propanol, t-butyl alcohol, isoamyl alcohol, and 1-hexanol. Suitable alkaline compounds which can be used include sodium hydroxide, potassium hydroxide, lithium hydroxide, sodium phosphate, potassium phosphate, sodium silicate, and potassium silicate. Regardless of the presence of the water-miscible organic solvent, the amount of the alkaline compound in the aqueous developing solution should not exceed about 20% by weight, and more preferably should be from about 0.5 to about 10% by weight, of the total amount of the aqueous developing solution. The pH should range from about 7 to about 13.5, which shifts to about 7 to about 12 and more preferably 7 to 11 when a water-miscible organic solvent is present. The developing solution can also contain a surface active agent [such as those described in J. Grant, Ed., *Hackh's Chemical Dictionary*, 4th Ed., McGraw-Hill Book Co., New York (1969)], an oxidizing agent [such as, $H_2O_2$ (aqueous solution), HClO (aqueous solution), NaClO, $KClO_2$, $NaClO_2$, $KClO_3$, $NaClO_3$, HBrO (aqueous solution), $KBrO_3$, $NaBrO_3$, etc.], etc.

Developing can be accomplished at a temperature between about 10° C. and about 95° C. and more preferably between about 15° C. and about 90° C. At development, a mere immersion of the photosensitive material in the developing solution may be sufficient, or the developing solution may be agitated. Alternatively, the developing solution can be sprayed on the image forming material and during immersion or spraying, the material may be subjected to a light rubbing action, e.g., with a brush or a cotton pad. Such processing may be carried out manually or using an automatic or semiautomatic apparatus.

As a result of the developing processing, an image comprising the photosensitive layer, the stripping layer and the adhesive layer, if present, is produced. After development, the image forming material is rinsed with water and dried to obtain a masking image on the support. Suitable methods for drying which can be employed include, e.g., natural drying, drying by simply heating, drying using infrared radiation, drying using a hot air flow, drying on a hot plate, etc. A suitable temperature for drying is about 20° C. to about 130° C., preferably 40° C. to 120° C. The resulting image functions as the final image, or the resulting image can be further treated as described below.

When a lacquer containing a colorant absorbing near ultraviolet-visible light is coated on the non-image areas of the image bearing material, and is dried (hereinafter referred to as lacquer opaque) and then the image areas are removed by stripping from the support, whereby a cleavage takes place in such a manner that all layers up to the stripping layer are removed, the areas covered with the lacquer opaque remain to produce an image reverse in an image sense, i.e., an image in which the relationship of light and dark or of colored and uncolored portions is reversed relative to the initial image. In order to remove the image areas comprising the photosensitive resin composition layer, a sharp needle, the tip of a knife or of a pin-cette is adhered to an edge of the stripping layer, which is then pulled up and peeled away from the support by hand or using a pin-cette. It should be stressed that the image forming material disclosed in the present invention can be used in a variety of ways in image recording applications since the colorant which absorbs near ultraviolet-visible light can be incorporated not only in the photo-sensitive coating but, if desired and depending on the properties of the colorant, in the stripping layer, which makes it easily possible to achieve an optical density to such light of above about 2.0, and further because of the high film strength, the high solvent resistance and the flexibility of the image, still other performance characteristics including easy elimination of the image as an integral connected piece of film, etc.

The following examples are given to further illustrate the present invention in greater detail. Unless otherwise indicated herein, all parts, percents, ratios and the like are by weight.

EXAMPLE 1

A peel coating of the following formulation, Coating Mixture (11), was coated on a 100 micron thick, transparent poly(ethylene terephthalate) film having a degree of transparency to light of about 99% using a whirler at a rotation of 100 rpm, and dried at 100° C. for 3 minutes. The thickness of the coating after drying was about 8 microns.

| Coating Mixture (11) | |
|---|---|
| Poly(vinyl alcohol) (Gohsenol GL-05, a product of Nippon Gosei Kagaku Kogyo Co.; degree of saponification: 86.5–89.0 mol %) | 10 g |
| Saponin | 0.1 g |
| Tartrazine (C.I. #19140, produced by Daiwa Senryo Co.) | 3.2 g |
| Rhodamine B (C.I. #45170, produced by Wako Pure Chemical Co.) | 0.8 g |
| Acrydine Orange (C.I. #46005, produced by Wako Pure Chemical Co.) | 0.2 g |
| Distilled Water | 90 ml |

On this coating was overcoated Coating Mixture (12) with a whirler at a rate of 100 rpm, and the photosensitive coating thus provided was dried at 100° C. for 2 minutes to a dried thickness of about 2 microns.

| Coating Mixture (12) | |
|---|---|
| Benzyl Methacrylate/Methacrylic Acid Copolymer (molar ratio: 73:23; $[\eta]^{methyl\ ethyl\ ketone}_{25°\ C.} = 0.12$) | 1 g |
| Trimethylolpropane Triacrylate | 0.8 g |
| Michler's Ketone | 0.1 g |
| Benzanthrone | 0.1 g |
| Methyl Ethyl Ketone | 7 g |
| Methyl Cellosolve Acetate | 7 g |

The photosensitive material thus prepared had optical densities as shown below. These optical density values were obtained by measurements with a Macbeth Densitometer (TD-504).

Density to white light = 0.71 (wavelength region; from about 400 to about 700 nm)
Density to red light = 0.07 (wavelength region; from about 600 to about 700 nm)
Density to green light = 3.47 (wavelength region; from about 500 to about 600 nm)
Density to blue light = 3.45 (wavelength region; from about 400 to about 500 nm)

In the subsequent examples, each of the color lights used for the same measurements had the same wavelength range.

Then, through a positive standard test pattern original, the photosensitive material was exposed for 30 seconds to light using a 2 KW high pressure mercury lamp (Jet-Printer 2000, a product of Orc Seisakusho Co.) at a distance of 50 cm.

The exposed material was processed by immersion in Developer Solution (13) of the following composition at 31° C. for 20 seconds then rinsed with water and dried at 100° C. for 2 minutes.

| Developer Solution (13) | |
|---|---|
| NaOH | 4 g |
| Na$_3$PO$_4$ | 10 g |
| KBrO$_3$ | 10 g |
| Sodium Salt of Higher Alcohol Sulfuric Acid Ester (Monogen Y-100, available from Dai-ichi Kogyo Pharmaceutical Co.) | 5 g |
| Distilled Water | 1000 ml |

When the imaging material was immersed in Developer Solution (13), the unexposed and therefore unpolymerized, areas were dissolved together with the underlying areas of the colored stripping layer while the exposed, photopolymerized areas remained on the support in conjunction with the underlying colored stripping layer, thus forming a negative image. The resulting image could be used as a negative mask for a photosensitive material having a spectral sensitivity to light of a wavelength of 300 to 550 nm.

Then, a red lacquer opaque which can absorb near ultraviolet light was spread on the non-image, background areas of the material and dried. The lacquer opaque layer had a dried thickness of about 6 microns. The tip of a sharp stylus was stuck in an edge of the stripping layer constituting the negative image, and the edge was pulled up. When the pulled up edge was grasped by the fingers and stripped off, a cleavage took place at the boundary between the stripping layer and the support and the negative image peeled away as a single piece of film. Hence, a positive image comprising the lacquer opaque coating remaining on the support was obtained.

EXAMPLE 2

On the same type of support as described in Example 1, a stripping layer of the following Coating Mixture (21) was spread with a whirler at 100 rpm, and the coated layer was dried at 100° C. for 3 minutes. The coating thickness was about 4 microns after drying.

| Coating Mixture (21) | |
|---|---|
| Poly(vinyl alcohol) (Gohsenol GL-05) | 10 g |
| Saponin | 0.1 g |
| Distilled Water | 90 ml |

Then, Coating Mixture (22) for a photosensitive layer of the following composition was overcoated thereon using a whirler at 100 rpm, and dried at 100° C. for 2 minutes to a dried coating thickness of about 4 microns.

| Coating Mixture (22) | |
| --- | --- |
| Benzyl Methacrylate/Methacrylic Acid Copolymer (molar ratio, BMA: MA = 73:27; $[\eta]^{MEK}_{25°\,C.} = 0.12$) | 1 g |
| Trimethylolpropane Triacrylate | 0.8 g |
| Benzanthrone | 0.1 g |
| Michler's Ketone | 0.1 g |
| Microlith Yellow 2R-A (a product of Ciba-Geigy Co.) | 0.3 g |
| Microlith Red GR-A (a product of Ciba-Geigy Co.) | 0.3 g |
| Microlith Blue 4G-A (a product of Ciba-Geigy Co.) | 0.03 g |
| Methyl Ethyl Ketone | 7 g |
| Methyl Cellosolve Acetate | 7 g |

The image recording material thus prepared had the following optical densities obtained with a Macbeth Densitometer (TD-504).

$D_{white} = 0.94$
$D_{red} = 0.43$
$D_{green} = 2.99$
$D_{blue} = 3.94$

When the material was imagewise exposed and developed in a similar manner to Example 1 and dried at 100° C. for 2 minutes, the resulting negative mask exhibited as good a masking effect and strippability as in Example 1.

EXAMPLE 3

On the same type of support as described in Example 1, a stripping layer using Coating Mixture (31) of the following composition was spread with a whirler at 120 rpm, and the coated layer was dried at 100° C. for 3 minutes.

| Coating Mixture (31) | |
| --- | --- |
| Poly(vinyl alcohol) (Gohsenol GL-05) | 10 g |
| Saponin | 0.1 g |
| Tartrazine (C.I. #19140, a product of Daiwa Senryo Co.) | 1.5 g |
| Acridine Orange (C.I. #46005, a product of Wako Pure Chemical Co.) | 0.5 g |
| Distilled Water | 90 ml |

Further, on the photosensitive layer was coated Coating Mixture (32) with a whirler at 120 rpm and dried at 100° C. for 2 minutes. The dried coating had a thickness of about 4 microns.

| Coating Mixture (32) | |
| --- | --- |
| Benzyl Methacrylate/Methacrylic Acid Copolymer (molar ratio; BMA: MA = 73:27; $[\eta]^{MEK}_{25°\,C.} = 0.12$) | 1 g |
| Trimethylolpropane Triacrylate | 0.8 g |
| Benzanthrone | 0.1 g |
| Michler's Ketone | 0.1 g |
| Microlith Red GR-A | 0.4 g |
| Microlith Blue 4G-A | 0.03 g |
| Methyl Ethyl Ketone | 7 g |
| Methyl Cellosolve Acetate | 7 g |

The recording material thus prepared exhibited the optical density characteristics as shown below, these optical density values being obtained with a Macbeth Densitometer (TD-504).

$D_{white} = 0.76$
$D_{red} = 0.27$
$D_{green} = 2.66$
$D_{blue} = 3.95$

On imagewise exposure and development, carried out in a similar manner to Example 1, and drying at 100° C. for 2 minutes, a negative mask image resulted, which showed as good a masking effect and strippability as in Example 1.

EXAMPLE 4

On a 100 micron thick poly(ethylene terephthalate) film, a stripping layer was provided by coating the following Coating Mixture (41) with a whirler at 120 rpm and dried by evaporating the solvent at 100° C. for 3 minutes. The thickness of the dried layer was about 5 microns.

| Coating Mixture (41) | |
| --- | --- |
| Poly(vinyl alcohol) (Gohsenol GL-05) | 10 g |
| Saponin | 0.1 g |
| Tartrazine (C.I. #19140, a product of Daiwa Senryo Co.) | 0.5 g |
| Acridine Orange (C.I. #46005, a product of Wako Pure Chemical Co.) | 0.5 g |
| Glycerin | 1 g |
| Distilled Water | 90 ml |

On this stripping layer was coated an adhesive layer by spreading the following Coating Mixture (42) with a whirler at 150 rpm and by drying at 100° C. for 2 minutes, thus giving a coating thickness of about 0.2 microns.

| Coating Mixture (42) | |
| --- | --- |
| Methanol Soluble Nylon (produced by BASF Co.) | 0.1 g |
| Methanol | 7 g |
| n-Butanol | 3 g |

Then the following Coating Mixture (43) was overcoated to provide a photosensitive resin composition layer using a whirler at 120 rpm, and dried at 100° C. for 2 minutes. The coating thickness after drying was about 4 microns.

| Coating Mixture (43) | |
| --- | --- |
| Benzyl Methacrylate/Methacrylic Acid Copolymer (molar ratio, BMA: MA = 73:27; $[\eta]^{MEK}_{25°\,C.} = 0.12$) | 1 g |
| Trimethylolpropane Triacrylate | 0.8 g |
| Benzanthrone | 0.1 g |
| Michler's Ketone | 0.1 g |
| Microlith Red GR-A | 0.4 g |
| Microlith Blue 4G-A | 0.03 g |
| Methyl Ethyl Ketone | 7 g |
| Methyl Cellosolve Acetate | 7 g |

Photosensitive image forming material (4) thus prepared had the following optical density obtained by measurements with a Macbeth Densitometer.

$D_{white} = 0.76$
$D_{red} = 0.28$
$D_{green} = 2.72$ $D_{blue} = 4.06$

Separately, another material (4C) was prepared for the purposes of comparison in which the same preparation steps as described above were repeated except that the adhesive layer was not employed.

Each of materials (4) and (4C) was imagewise exposed through a positive mask having a standard pattern using a 2 KW ultra-high pressure mercury lamp (Jet-printer 2000, a product of Orc Seisakusho Co.) at a distance of 50 cm for 30 seconds. Both of the exposed materials were immersed in Developing Solution (44) having the following composition at 31° C. for 20 seconds, then rinsed with water and dried at 100° C. for 2 minutes.

| Developer Solution (44) | |
|---|---|
| NaOH | 4 g |
| Na$_3$PO$_4$ | 10 g |
| KBrO$_3$ | 10 g |
| Sodium Salt of Higher Alcohol Sulfuric Acid Ester (Monogen Y-100) | 5 g |
| Distilled Water | 1000 ml |

A negative image in which the relationship between light and shadow was reverse to that of the standard test pattern was obtained in this development.

Next, the lacquer opaque as described in Example 1 was rubbed in the background areas of the member and dried. The thickness of the lacquer opaque layer was 6 microns after drying. The tip of a sharp stylus was stuck in an edge of the stripping layer forming the negative image, and the edge was pulled up. When the pulled edge was grasped with the fingers and stripped off, cleavage took place at the boundary between the stripping layer and the support whereby the negative image peeled away as a single piece of film. Thus, a positive image comprising the lacquer opaque coating remaining on the support was obtained.

Independently, an adhesion test was performed on the negative image bearing materials (4) and (4C). An adhesive tape was firmly bonded onto the surface of the image areas and then peeled off whereby the tape was removed without damaging the photosensitive layer of material (4), but for material (4C) cleavage occurred at the boundary between the stripping layer and the photosensitive layer, in other words, the photosensitive layer was removed together with the adhesive tape. This result shows that the adhesive layer provided improved the adhesion between the stripping layer and the photosensitive layer in material (4) and that it also promoted a clear separation between the stripping layer and the support.

EXAMPLE 5

On the same type of support as described in Example 1, a stripping layer was provided by whirler coating the following Coating Mixture (51) to a thickness of 3 microns.

| Coating Mixture (51) | |
|---|---|
| Poly(vinyl alcohol) (Gohsenol GL-05) | 10 g |
| Saponin | 0.1 g |
| Tartrazine (C.I. #19140) | 6.4 g |
| Rhodamine B (C.I. #45170) | 1.6 g |
| Acridine Orange (C.I. #46005) | 0.4 g |
| Distilled Water | 90 ml |

After drying this coating at 100° C. for 3 minutes, Coating Mixture (42) described above was whirler coated and dried at 100° C. for 2 minutes to a thickness of 0.2 microns.

Finally, a positive-working type diazo sensitizing solution AZ-1350 (a mixture of naphthoquinone-(1,2)-diazide(5)-sulfonic acid ester and an alkali-soluble novolak resin), produced by the Shipley Co. was whirler coated and dried at 100° C. for 2 minutes. The coating thickness was 2 microns.

When the material thus prepared was exposed to light through a negative mask and developed in the same manner as in Example 1, an equivalent result was obtained.

While the invention has been described in detail and with reference to specific embodiments thereof, it will be apparent to one skilled in the art that various changes and modifications can be made therein without departing from the spirit and scope thereof.

What is claimed is:

1. A photosensitive image forming material consisting essentially of a transparent support having thereon, in order, a stripping layer of poly(vinyl alcohol), an adhesive layer consisting of an alcohol soluble polyamide which strengthens the adhesive bond between the stripping layer and a photosensive resin composition layer thus preventing the photosensitive resin composition layer from peeling off prior to development, while, on the other hand, during development the alcohol-soluble polyamide layer is dissolved or swelled by the aqueous developing solution at the areas where the overlying photosensitive resin composition layer is dissolved and removed simultaneously with the corresponding portion of the underlying stripping and adhesive layers to produce a visible image, and at least one of the layer of the poly(vinyl alcohol) or the photosensitive resin composition layer containing a colorant.

2. The photosensitive image forming material of claim 1, wherein the transparent support is a support having a thickness of from about 50μ to about 2 mm which transmits about 40% or more of incident light with a wavelength of from about 290 nm to about 700 nm.

3. The photosensitive image forming material of claim 2, wherein said support comprises a film of cellulose nitrate, cellulose acetate, cellulose acetate butyrate, cellulose acetate propionate, polystyrene, polyethylene terephthalate, or polycarbonate.

4. The photosensitive image forming material of claim 1, wherein said poly(vinyl alcohol) has a degree of saponification of from about 50 to 100 mol % and a molecular weight corresponding to a viscosity of a 4 wt. % aqueous solution at 20° C. of from about 2 cps to about 70 cps.

5. The photosensitive image forming material of claim 1, wherein the alcohol soluble polyamide is an alcohol soluble nylon, soluble in methanol to an extent of greater than about 0.1% by weight at 25° C.

6. The photosensitive image forming material of claim 1, wherein said photosensitive resin comprises a diazonium salt/paraformaldehyde condensate, an o-quinone diazide, a water or alkali-soluble azide compound or polymer, a photo-polymerizable acrylamide derivative, a photo-polymerizable composition containing diacrylate derivatives, a photo-polymerizable acrylic acid ester or methacrylic acid ester, a photo-polymerizable polymer having a carboxyl group in the side chain thereof and containing a double bond therein, poly(methacrylic acid) containing photo-polymerizable composition or a photocrosslinkable photosenstive resin comprising a polymer having thereon an amino group substituted with an aromatic group in combination with a compound having a poly-halogenated methyl group.

7. The photosensitive image forming material of claim 1, wherein said colorant is a dye, a pigment or a mixture thereof.

8. The photosensitive image forming material of claim 1, wherein said support has a thickness of from about 50 microns to about 2 mm, said layer of poly(vinyl alcohol) has a thickness of about 0.5 μm to about 15 μm, said layer of said alcohol soluble polyamide has a thickness of from about 0.05 to about 3 microns and said layer of the photosensitive resin composition has a thickness of from about 0.5 μm to about 15 μm.

9. The photosensitive image forming material of claim 1, wherein said photosensitive resin composition is a photopolymerizable composition containing an ester of acrylic or methacrylic acid and a polyol, a photo-polymerization initiator, and a copolymer containing a repeating unit derived from acrylic or methacrylic acid and a repeating unit derived from benzyl acrylate or methacrylate.

10. A method for forming an image comprising (1) imagewise exposing to actinic light a photosensitive image forming material consisting essentially of (A) a transparent support having thereon, in order, (B) a stripping layer consisting of poly(vinyl alcohol), (C) a layer of an alcohol soluble polyamide which strengthens the adhesive bond between the stripping layer and a photosensitive resin composition layer thus preventing the photosensitive resin composition layer from peeling off prior to development, and (D) a photosensitive resin composition layer, while, on the other hand, during development the alcohol-soluble polyamide layer is dissolved or swelled by the aqueous developing solution at the areas where the overlying photosensitive resin composition layer is dissolved and removed by the aqueous developing solution, permitting the aqueous developing solution to reach the stripping layer, and at least one of the layer of the poly(vinyl alcohol) or the photosensitive resin composition layer containing a colorant, and (2) developing said exposed material in a single developing operation with an aqueous developing solution whereby soluble portions of said photosensitive resin composition layer are removed in conjunction with the corresponding portions of said layers of alcohol soluble polyamide and poly(vinyl alcohol) to leave a visible image on said support comprising the layer of the photosensitive resin composition layer and the layers of alcohol soluble polyamide and poly(vinyl alcohol) thereunder remaining.

11. The method of forming an image of claim 10, wherein the transparent support is a support having a thickness of from about 50μ to about 2 mm which transmits about 40% or more of incident light with a wavelength of from about 290 nm to about 700 nm.

12. The method of forming an image of claim 10, wherein said support comprises a film of cellulose nitrate, cellulose acetate, cellulose acetate butyrate, cellulose acetate propionate, polystyrene, polyethylene terephthalate, or polycarbonate.

13. The method of forming an image of claim 10, wherein said poly(vinyl alcohol) has a degree of saponification of from about 50 to 100 mol% and a molecular weight corresponding to a viscosity of a 4 wt.% aqueous solution at 20° C. of from about 2 cps to about 70 cps.

14. The method of forming an image of claim 10, wherein said photosensitive resin is a diazonium salt-/paraformaldehyde condensate, an o-quinone diazide, a water or alkali-soluble azide compound or polymer, a photo-polymerizable acrylamide derivative, a photo-polymerizable composition containing diacrylate derivatives, a photo-polymerizable acrylic acid ester or methacrylic acid ester, a photo-polymerizable polymer having a carboxyl group in the side chain thereof and containing a double bond therein, a poly(methacrylic acid) containing photo-polymerizable composition or a crosslinkable photosensitive resin comprising a polymer having thereon an amino group substituted with an aromatic group in combination with a compound having a poly-halogenated methyl group.

15. The method of forming an image of claim 10, wherein said colorant is a dye, a pigment or a mixture thereof.

16. The method of forming an image of claim 10, wherein said support has a thickness of from about 50μ to about 2 mm, said layer of poly(vinyl alcohol) has a thickness of about 0.5 μm to about 15 μm, and said layer of the photosensitive resin composition has a thickness of from about 0.5 μm to about 15 μm.

17. The method of forming an image of claim 10, wherein said aqueous developing solution is water or a mixture of water and one or more water-miscible organic solvents, the organic solvent being present in an amount of about 50% by volume or less.

18. The method of forming an image of claim 10, wherein said aqueous developing solution additionally contains an alkaline compound.

19. The method of forming an image of claim 10, wherein said photosensitive resin composition additionally includes a layer of an alcohol soluble polyamide between said layer of poly(vinyl alcohol) and said layer of the photosensitive resin composition.

20. The method of forming an image of claim 19, wherein the alcohol soluble polyamide is an alcohol soluble nylon, soluble in methanol to an extent of greater than about 0.1% by weight at 25° C.

21. The method of forming an image of claim 10, wherein said photosensitive resin composition is a photopolymerizable composition containing an ester of acrylic or methacrylic acid and a polyol, a photo-polymerization initiator, and a copolymer containing a repeating unit derived from acrylic or methacrylic acid and a repeating unit derived from benzyl acrylate or methacrylate.

* * * * *